United States Patent [19]

Hein et al.

[11] 4,234,676
[45] Nov. 18, 1980

[54] POLYTHIOL EFFECT CURABLE POLYMERIC COMPOSITION

[75] Inventors: Paul R. Hein, Marietta; James A. Evans, Atlanta; Michael W. Yang, Marietta, all of Ga.

[73] Assignee: W. R. Grace & Co., Cambridge, Mass.

[21] Appl. No.: 871,931

[22] Filed: Jan. 23, 1978

[51] Int. Cl.$^2$ .................... G03F 7/08; C33F 7/10
[52] U.S. Cl. .................... 430/286; 204/159.15; 204/159.16; 204/159.17; 427/44; 427/54.1; 430/300; 430/306; 430/313
[58] Field of Search .............. 96/35.1, 36.3; 427/44, 427/54, 54.1; 260/859 R, 881, 885, 880 R; 204/159.15, 159.16, 159.17; 430/300, 313, 286, 306

[56] References Cited

U.S. PATENT DOCUMENTS

| | | |
|---|---|---|
| 3,024,180 | 3/1962 | McGraw . |
| 3,029,223 | 4/1962 | Hibbard . |
| 3,051,695 | 8/1962 | Warner et al. |
| 3,084,115 | 4/1963 | Smith et al. |
| 3,144,422 | 8/1964 | Homberg . |
| 3,149,182 | 9/1964 | Porter . |
| 3,240,844 | 3/1966 | Gruver . |
| 3,265,765 | 8/1966 | Holden et al. |
| 3,297,745 | 1/1967 | Fekete et al. |
| 3,509,234 | 4/1970 | Burlant et al. |
| 3,615,450 | 10/1971 | Werber et al. |
| 3,627,529 | 12/1971 | Frank et al. |
| 3,640,923 | 2/1972 | Guthrie . |
| 3,661,744 | 5/1972 | Kehr et al. |
| 3,666,461 | 5/1972 | Kehr et al. |
| 3,674,486 | 7/1972 | Milgrom . |
| 3,697,621 | 10/1972 | Kehr et al. |
| 3,716,466 | 2/1973 | Hook .................. 204/159.17 |
| 3,783,152 | 1/1974 | Larsen . |
| 3,832,421 | 8/1974 | Morgan . |
| 3,843,502 | 10/1974 | Pearson et al. |
| 3,843,572 | 10/1974 | Morgan . |
| 3,850,770 | 11/1974 | Juna et al. |
| 3,864,229 | 2/1975 | Zapp et al. |
| 3,896,014 | 7/1975 | Rosenberg ................. 427/54 X |
| 3,898,349 | 8/1971 | Kehr et al. |
| 3,904,499 | 9/1975 | Morgan ................. 204/159.15 |
| 3,908,039 | 9/1975 | Guthrie et al. |
| 3,950,281 | 4/1976 | Usamoto et al. |
| 3,954,584 | 5/1976 | Miyata et al. ................. 427/54 X |
| 4,008,341 | 2/1977 | Kehr . |
| 4,012,302 | 3/1977 | Wang et al. ................. 427/54 X |
| 4,045,231 | 8/1977 | Toda et al. |
| 4,048,036 | 9/1977 | Prucnal ................. 427/54 X |
| 4,057,431 | 11/1977 | Finelli et al. |
| 4,058,443 | 11/1977 | Murata et al. ................. 204/159.17 |
| 4,064,287 | 12/1977 | Lipson et al. ................. 427/53 |
| 4,084,020 | 4/1978 | Mathias et al. ................. 427/41 |
| 4,100,329 | 7/1978 | Neithardt, Jr. ................. 427/54 X |
| 4,120,721 | 10/1978 | Ketley et al. ................. 96/36.3 |

FOREIGN PATENT DOCUMENTS

| | | |
|---|---|---|
| 885388 | 11/1971 | Canada . |
| 924047 | 4/1973 | Canada . |
| 926183 | 5/1973 | Canada |
| 930094 | 7/1973 | Canada |
| 2456439 | 8/1976 | Fed. Rep. of Germany . |
| 2103825 | 4/1972 | France |
| 1312492 | 4/1973 | United Kingdom |
| 1350260 | 4/1974 | United Kingdom |
| 1366769 | 9/1974 | United Kingdom . |
| 1379229 | 1/1975 | United Kingdom |
| 1395822 | 5/1975 | United Kingdom |
| 1420351 | 1/1976 | United Kingdom . |

OTHER PUBLICATIONS

Kuntz, I., J. Polymer Sci., vol. 54 (1961) 569–586.
Spirin, Y., J. Polymer Sci., vol. 58 (1962) 1181–1189.

*Primary Examiner*—Ronald H. Smith
*Assistant Examiner*—Thurman K. Page
*Attorney, Agent, or Firm*—Edward J. Hanson, Jr.; C. Edward Parker

[57] ABSTRACT

Curable composition characterizing by its containing (1) 10 to 97% by weight of a material chosen from the group consisting of C—C unsaturated polymers exemplified by monoalkenyl aromatic diene copolymers, halogen substituted butadienes, acrylonitriles and acrylurethanes and C—C saturated polymeric binders such as the polyvinylpyrolidones, cellulose acetate butyrates and cellulose acetate succinates; (2) at least 1% by weight of material (1) of at least one monomer substantially compatible with material (1) and having at least one cross-linkable C—C double bond; (3) 0.1 to 35% by weight of material (1) of thiol exemplified by polythiols; and optionally (4) a curing agent. The disclosure is directed primarily at printing plate production with a composition containing 0.01 to 10% by weight of material (1) of a photoinitiator and a monomer that is an addition photopolymerizable ethylenically unsaturated acrylic or methacrylic acid ester containing two or more acrylate or methacrylate groups per molecule or mixtures thereof. In an alternate form low molecular weight liquid rubber polymer may be included in the composition. Other materials such as stabilizers may also be present.

6 Claims, No Drawings

POLYTHIOL EFFECT CURABLE POLYMERIC COMPOSITION

BACKGROUND OF THE INVENTION

This invention relates to a curable composition and especially to a curable composition that can have controlled cure through the use of appropriate curing agents.

It is known that printing plates can be manufactured by hardening ethylenically unsaturated compounds which become crosslinked and insolubilized under action of actinic rays in the presence of photosensitizers. In hardening such compositions to form printing plates at room temperature under action of actinic rays, addition polymerization of polymerizable double bonds in the compounds is inhibited by air. This inhibition causes a very fine liquid film to reside on the surface causing various degrees of tack. Consequently, it is presently generally considered desirable to replace the oxygen at the photosensitive surface with an inert gas, treat the surface with chemical additives that absorb or render the oxygen inactive, or use very intense light sources that literally burn away the oxygen.

It is a primary object of the present invention to provide a liquid or solid photo-crosslinkable composition for the manufacture of relief printing plates which substantially meet the following:

1. Even in the presence of air, image-wise exposure of the composition gives a completely tack-free surface, eliminating the need for subsequent post exposure treatment of the crosslinked areas forming the relief image or for expensive equipment for carrying out the exposure in the absence of oxygen.

2. The requisite exposure time for the composition should be as brief as possible in order to achieve a short cycle time for the manufacture of a finished printing plate as might be demanded by the newspaper industry.

There are a number of U.S. and foreign patents that show photocurable compositions that have as major chemically functioning constituent a polythiol. This is unlike the present invention wherein the thiol constituent seemingly acts in some way to regulate and make more effective the polymerization of the other constituent components of the composition. In one species of the generic invention the resin is C—C unsaturated and crosslinks with monomer as a major characterizing reaction with the thiol being in an amount to primarily act, in substance, almost like a scavenger to close off oxygen interference without changing the other basic properties of the system and the end product from what they would be without the thiol. The other species which has the binder that is C—C saturated has the thiol functioning in the same manner but it is the monomer that crosslinks with itself forming the latice with the binder filling the space between the crosslinked chains and being bound thereby. The binder earlier acted as a matrix to hold the crosslinking monomer in position to form a proper product. The curable compositions of the present invention as a general rule cure within minutes without the presence of the thiol although with the presence of the preferred polythiol the cure is usually even faster. Examples of patents that show photocurable compositions that have a polythiol as a major chemically functioning constituent are U.S. Pat. Nos. 4,008,341 3,843,572; 3,832,421; 3,783,152; 3,666,461; 3,661,744; 3,627,529; and 3,615,450 and Canadian Pat. Nos. 930,094; 926,183; 924,047 and 885,388. Also the general theory as represented at pages 22–24 has been in general known to scientists.

Many other patents independently reveal various features of the inventive composition. They however lack the overall advantage presented by the synergistic activity of the present new composition. For example U.S. Pat. No. 3,674,486 and British Pat. Nos. 1,366,769 and 1,395,822 discloses compositions having an A-B-A type block copolymer which is a constituent of some species of the present invention. Similarly A-B block copolymer compositions are disclosed in German Patent Publications DT OS 24 56 439 and DT OS 26 10 206. A liquid ethylenically unsaturated polyetherurethane composition capable of being polymerized by actinic light to yield a solid is shown in U.S. Pat. No. 4,057,431. French patent publication No. 2,103,825 reveals acrylonitrile-butadiene copolymer compositions also containing an acrylate monomer.

SUMMARY OF THE INVENTION

The composition, method of forming a coating on a substrate and method of forming a printing plate of the present invention provide articles having essentially non-tacky surfaces. An essential element in carrying out the invention is a composition having the following essential characteristics:

(1) about 10% to about 97% by weight of the composition is a material chosen from the group consisting of C—C unsaturated polymeric resin, C—C saturated polymeric binder and mixtures thereof;

(2) at least about 1% by weight of material (1) of at least one monomer having at least one cross-linkable C—C unsaturated bond; and (3) about 0.1 to about 35% by weight of material (1) of a thiol.

The composition is distinctive in limiting the thiol to an amount that will not basically change the curing properties of the composition from what they are with the thiol omitted therefrom. The composition is further distinctive in that the radiation cured composition has a tacky surface when the composition is maintained the same except the thiol is omitted and sufficient thiol is included in the composition to provide a substantial reduced tackiness on the surface or a tack-free surface.

Preferably the monomer is an addition polymerizable ethylenically unsaturated acrylic or methacrylic acid ester containing two or more acrylate or methacrylate groups per molecule or mixtures thereof and is present in an amount of at least about 5%, and in some embodiments more preferably 15–30% by weight of material (1). The thiol is preferably a polythiol and is preferably present in an amount of 0.5 to 10% by weight of material (1), and the method further preferably includes applying the radiation curable composition to a polyester film substrate in a coating thickness of about 2 to about 200 mils before radiation.

The C—C unsaturated polymeric resin of material (1) is preferably chosen from the group consisting of monoalkenyl aromatic diene copolymers, halogen substituted butadiene, acrylonitriles, acrylurethanes and mixtures thereof. There are two alternate preferred species of this preferred C—C unsaturated polymeric resin group. In one specie the resin has a macromolecular structure and is a polyene having a weight average molecular weight of at least about 5,000 and is present in an amount of at least about 60% of the composition. Another specie is an acrylurethane that is a radiation curable liquid acrylic or methacrylic terminated polyene.

The C—C saturated polymeric binder of material (1) preferably has a macromolecular structure and a weight average molecular weight of at least about 5,000 and is present in an amount of at least about 40%, more preferably at least about 60%, of the composition. Preferably the C—C saturated binder is chosen from the group consisting of polyvinylpyrolidones, cellulose acetate butyrates and cellulose acetate succinates and mixtures thereof.

The polymer, material (1), is preferably present in an amount of no more than 95%, more preferably in an amount of 50-90%.

Best Mode

The present invention in its preferred embodiment provides a method of forming a coating on a substrate which comprises applying to the surface of a substrate a layer of the composition described in the summary of the invention. The monomer is specified specifically as being radiation crosslinkable. After its application in a layer the composition is exposed to radiation chosen from the group consisting of actinic, high energy ionizing or a combination thereof.

Preferably a photoinitiator is included in an amount of about 0.01 to about 10%, more preferably 0.2 to 5% by weight of material (1) of the composition. This leads to the main form of the best mode wherein a method of forming the coating into a printing plate appertains. This involves in its preferred embodiment exposing the coating to actinic radiation projected through an image-bearing transparency curing selected portions thereof. The following description will deal primarily with the latter embodiments including only enough references to the other embodiments to enable those skilled in the art to readily appreciate the convenience of the operation of some of these embodiments.

The C—C unsaturated polymeric resins that are preferred for operation of the preferred embodiments of the invention may be chosen from the group consisting of monoalkenyl aromatic diene copolymers, butadienes, acrylonitriles and acrylurethanes. The preferred monoalkenyl aromatic-diene copolymer resin is the type having the general formula: A-B-A wherein the end blocks A are monoalkenyl aromatic polymer blocks which may be the same or different and which have an average molecular weight of from 2,000 to 100,000 and a glass transition temperature above 25° C., the total block A content being 10-50% by weight of the copolymer, and B is an elastomeric diene polymer block having an average molecular weight of from 25,000 to 1,000,000 and a glass transition temperature below 10° C.

These end blocks (A) are typically derived from monoalkenyl aromatic compounds having the general formula:

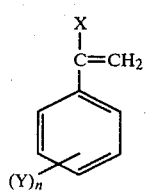

wherein X represents hydrogen or an alkyl radical containing 1 or 2 carbon atoms such as a methyl or ethyl radical; Y represents hydrogen or an alkyl radical containing from 1 to 4 carbon atoms such as a methyl, ethyl, n-propyl, isopropyl, n-butyl, sec-butyl or a tert-butyl radical; and n represents an integer from 1 to 5. Examples of the alkenyl aromatic compounds which are within the scope of formula A are: styrene, alpha-methyl styrene, tert-butyl styrene, vinyl toluene, ortho- and para-methyl styrenes, ortho- and para-methyl-alpha-methyl styrenes, and ortho- and para-ethyl styrenes.

The elastomeric block (B) is preferably a diene polymer block derived from a conjugated diene hydrocarbon compound having the general formula:

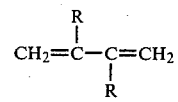

wherein each R individually represents hydrogen or an alkyl radical containing 1 or 2 carbon atoms such as a methyl or ethyl radical. Examples of the conjugated diene hydrocarbon compounds which are within the scope of block B are 1,3-butadiene and 2-methyl-1,3-butadiene.

Typical examples of the just described monoalkenyl aromatic-diene block copolymers, useful in the present invention, are described in U.S. Pat. No. 3,265,765, the contents of which are incorporated herein by reference.

An alternate but in general less desirable monoalkenyl aromatic-diene copolymer resin - for use in the present invention -is of the type having the general formula:

A-B wherein blocks A and B are the same as those designated by the same letters in the A-B-A block copolymer. The A-B type copolymer resin can have a sharp or a blurred, i.e. a "flowing" transition between the two block segments of the copolymer formed solely from diene-hydrocarbons or styrene-monomers. The two-block-copolymers contain 5 to 70 and preferably 10 to 40% by weight in units of the last mentioned monomer of the styrene type, and consequently 30 to 95 and preferably 60 to 90% by weight of polymerized-end units of diene-hydrocarbon. The production of the two-block copolymers of the above mentioned type is known per se and can in particular take place according to the procedure described in U.S. Pat. No. 3,149,182. Reference is also made to the articles by I. Kuntz, J. Polymer Sci. 54 (1961), 569–586 and Y. U. Spirin et al, J. Polymer Sci. 58 (1962) 1181–1189. The copolymers can be produced continuously or discontinuously. In the production of copolymers with sharply separated block segments through stepwise copolymerization, it is advantageous to start with the polymerization of the monomer which quantitatively preponderates. Advantageously, the two-block copolymers are produced by solution-polymerization whereby suitable solvents are in particular hydrocarbons or mixtures thereof as well as polar solvents such as tetrahydrofurane. The type of solvent influences the fine structure of the two-block copolymer like the configuration of the diene-polymer segments. Preferably hydrocarbons are used as solvents. It is particularly advantageous to use the solutions of the block copolymers produced by solution-polymerization either directly or in concentrated state, after adding the other coating constituents for producing the photo-crosslinkable layer by casting.

Suitable two-block copolymers of the indicated type, measured as 0.5% by weight solutions in toluene, have viscosity numbers of approximately 60 to 350 ml/g and in particular 90 to 250 ml/g, corresponding to a molecular weight range $\overline{M}_v$ of approximately 75,000 to 200,000.

The preferred butadienes are the halogen substituted butadienes and more preferable the 1,3-butadiene type, most preferably 2-chloro-1, 3-butadiene, 2-fluoro-1, 3-butadiene and 2,3-dichloro-1,3-butadiene. The most preferred of all of the halogen substituted butadienes is the 2-chloro-1, 3-butadiene (chloroprene).

The preferred acrylonitrile resins are copolymers of butadiene and acrylonitrile with the acrylonitrile comprising 22–32% of the copolymer weight.

The preferred acrylurethane resins are those prepared by reacting a diisocyanate monomer with the polyethylene or polypropylene glycols having a molecular weight of up to about 2500 such that 0.8 to 1.2 moles of the diisocyanate monomer reacts with one stoichiometric equivalent of the hydroxyl groups, and then reacting said reaction product with a polymerizable acrylate ester of methacrylate ester having a hydroxyl group such that one stoichiometric equivalent of the free isocyanate groups remaining in said reaction product reacts with 0.9 to 1.2 of the stoichiometric equivalent of the hydroxyl groups.

Diisocyanate monomers useful in the preparation of unsaturated acrylurethane resin include tolylene diisocyanate, xylylene diisocyanate, hexamethylene diisocyanate, diphenylmethane diisocyanate, 3,3'-bitolylene-4,4'-diisocyanate 3,3'-dimethyl diphenylmethane-4,4'-diisocyanate, phenylene diisocyanate, 4,4'-diphenylether diisocyanate, hydrogenated 4,4'-diphenylmethane diisocyanate, naphthalene diisocyanate, hydrogenated tolylene diisocyanate, lysine diisocyanate, and isophorone diisocyanate.

Dihydric or polyhydric alcohols useful for partial reaction with the diisocyanate monomers are polytheylene glycols and polypropylene glycols having a molecular weight of up to about 2500 and the general formula:

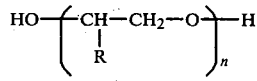

wherein R represents hydrogen or a methyl group and n is an integer from 3 to 450 particularly polyethylene glycols containing 8 to 10 hydrophilic ether groups. Polyethylene glycols containing at least 8 hydrophilic ether groups are hydrophilic and suitable for the preparation of the partially reacted products which are precursors of the unsaturated acrylurethane resin.

The polymerizable acrylate esters or methacrylate esters containing a hydroxyl group useful for further reaction to acrylurethane resin are represented by the general formula:

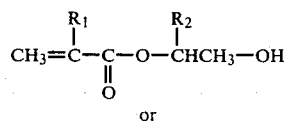

or

-continued

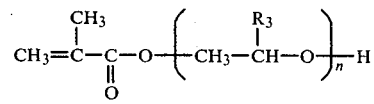

(wherein $R_1$, $R_2$ and $R_3$ are either hydrogen or methyl group respectively and n is an integer from 2 to 10) representative examples of such compounds are 2-hydroxyethyl acrylate, 2-hydroxypropyl acrylate, 2-hydroxyethyl methacrylate, 2-hydroxypropyl methacrylate, polyethylene glycol monomethacrylate, and polypropylene glycol monomethacrylates.

In consideration of the manufacture and performance of printing plates, it is desirable that the partially reacted acrylurethane resin should be prepared by using a dihydric or polyhydric alcohol having a molecular weight of up to about 2500. If the molecular weight of such an alcohol exceeds about 2500, the photo-reactivity of unsaturated acrylurethane resin drops and the air-drying property deteriorates. Moreover, when compatability of the unsaturated acrylurethane resin with other resins, solubility in water, and performance as printing plates are taken into account, the molecular weight of the alcohol used should preferably be from about 150 to about 1500. A dihydric or polyhydric alcohol with a molecular weight of up to about 2500 is allowed to react with a diisocyanate monomer such that free isocyanate groups still remain in the molecules of a partially reacted products, that is, 0.8 to 1.2 moles of the diisocyanate monomer is made to react with one stoichiometric equivalent of the hydroxyl groups. The unsaturated polymer acrylurethane is in general solid at a molecular weight of about 5000 and liquid at lower molecular weights.

The C—C saturated polymeric binder of constituent (1) may be the polyvinylpyrolidones, cellulose acetate butyrates and cellulose acetate succinates. Mixtures of these binders and/or other such binder may also be used, having in their preferred embodiments macromolecular polymeric structures having average molecular weights of at least about 5,000.

It is naturally also possible to use mixtures of the C—C unsaturated polymeric resins and of the C—C saturated binders of the indicated types. For some special applications small quantities of other compatible polymers and particularly elastomers may be combined with constituent (1).

Constituent (2) is a monomer that is a non-gaseous addition polymerizable ethylenically unsaturated compound, having a boiling point above 100° C. at atmospheric pressure, a molecular weight of about 100–1500 and being capable of forming high molecular weight addition polymers readily. Preferably the addition polymerization is by photoinitiated addition polymerization in the presence of an addition polymerization initiator. For better printing plate products the monomer is preferably an addition photopolymerizable polyethylenically unsaturated acrylic or methacrylic acid ester containing two or more acrylate or methacrylate groups per molecule or mixtures thereof. A few illustrative examples of such multifunctional acrylates are ethylene glycol diacrylate, ethylene glycol dimethacrylate, trimethylolpropane triacrylate, trimethylolpropane trimethacrylate, pentaerythritol tetra-acrylate or pentaerythritol - tetramethacrylate, hexanediol-1, 6-dimethacrylate, and diethylene-glycoldimethacrylate.

Also useful in some special instances are monoacrylates such as n-butyl-acrylate, n-butyl-methacrylate, 2-ethylhexyl-acrylate, lauryl-acrylate, and 2-hydroxypropyl-acrylate. Small quantites of amides of (meth) acrylic acid such as N-methylol-methacrylamide-butylether are also suitable. N-vinyl-compounds such as N-vinyl-pyrrolidone, vinyl-esters of aliphatic monocarboxylic acids such as vinyl-oleate, vinyl-ethers of diols such as butane-diol-1, 4-divinyl-ether and allyl-ether and allyl-ester are also suitable. Isocyanate free reaction products of organic polyisocyanates such as hexamethylene-diisocyanate, isophorone-diisocyanate or tolylene-diisocyanate with hydroxyl group containing (meth) acrylates such as glycolmonoacrylate, hydroxypropyl-methacrylate or 1,4-butane-diol-monoacrylate are also suitable as monomers provided they are adequately compatible with the resin. The same applies to the reaction products of di- or polyepoxides such as butane-diol-1, 4-diglycidyl-ether or bisphenol-Adiglycidyl-ether with (meth) acrylic acid. The characteristics of the photopolymerizable layers can be modified for the specific purpose by a suitable selection of monomers or mixtures thereof.

The thiols of the present invention are preferably polythiols that are either simple or complex organic compounds having a multiplicity of pendant or terminally positioned -SH functional groups per average molecule. The preferred polythiols must contain 2 or more —SH groups/molecule. They usually have a viscosity range of slightly about 0 to about 20 million centipoises (cps) at 70° C., as measured by a Brookfield Viscometer. Included in the term "polythiols" as used herein are those materials which in the presence of reactive plasticizers such as diallyl phthalate fall within the viscosity range set out above at 70° C. Operable polythiols in the instant invention usually have molecular weights in the range of about 94 to about 20,000 or more, preferably about 100 to about 10,000.

The preferred polythiols operable in the instant invention, those thiols which give tack free surfaces, can be exemplified by the general formaula: $R_8—(—SH)_n$ where n is at least 2 and $R_8$ is a polyvalent organic moiety free from "reactive" carbon to carbon unsaturation. Thus, $R_8$ may contain cyclic groupings and minor amounts of hetero atoms such as N,S,P or O but, primarily, contains carbon-hydrogen, carbon-oxygen or silicone-oxygen containing chain linkages free of any "reactive" carbon to carbon unsaturation.

One class of polythiols operable in the instant invention to obtain essentially odorless cured polythioether coatings and relief images are esters of thiol containing acids of the general formula: $HS—R_9—COOH$ where $R_9$ is an organic moiety containing no "reactive" carbon to carbon unsaturation with polyhydroxy compounds of the general structure: $R_{10}—(—OH)_n$ where $R_{10}$ is an organic moiety containing no "reactive" carbon to carbon unsaturation and n is 2 or greater. These components will react under suitable conditions to give a polythiol having the general structure:

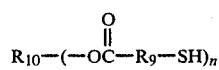

where $R_9$ and $R_{10}$ are organic moieties containing no "reactive" carbon to carbon unsaturation and n is 2 or greater.

Certain polythiols such as the aliphatic monomeric polythiols (ethane dithiol, hexamethylene dithiol, deca-methylene dithiol, tolylene-2, 4-dithiol, etc.) and some polymeric polythiols such as the thiol terminated ethylcyclohexyl dimercaptan polymer, etc. and similar polythiols which are conveniently and ordinarily synthesized on a commercial basis, although having obnoxious odors, are operable in this invention. Examples of the polythiol compounds preferred for this invention because of their relatively low odor level and fast curing rate include esters of thioglycolic acid ($HS—CH_2—COOH$), α-mercaptopropionic acid ($HS—CH(CH_3)—COOH$) and β-mercaptopropionic acid ($HS—CH_2CH_2COOH$) with polyhydroxy compounds such as glycols, triols, tetraols, pentaols, hexaols, etc. Specific examples of the preferred polythiols include ethylene glycol bis (thioclycolate), ethylene glycol bis (β-mercaptopropionate), trimethylolpropane tris (thioglycolate), pentaerythritol tetrakis (thioglycolate) and the most preferred pentaerythritol tetrakis (β-mercaptopropionate) and trimethylolpropane tris (β-mercaptopropionate), and mixtures thereof all of which are commercially available.

Monothiols such as β-mercaptopropionic acid can be used in some instances. Monothiols reduce tack significantly but do not eliminate it to the desired degree for general use.

The composition of the present invention is generally cured through the use of a curing agent which facilitates a controlled, rapid and determinable or predictable cure preformance. The curing agent generally acts as a free radical generating agent. Preferably the free radical generating agent includes initiation by radiation, either actinic light or high energy ionizing radiation. Most preferably the actinic radiation is UV radiation. The composition particularly lends itself to advantage in UV curing in forming relief images and especially for printing indicia production.

It is preferred that the UV light eminate from a point source or in the form of parallel rays but divergent beams are also operable as a source of actinic light. Practically any convenient source of high intensity UV light may be used. Such sources include carbon arcs, mercury arcs, fluorescent lamps with special ultraviolet light emitting phosphors, xenon arcs, sunlight, tungsten halide lamps, argon flow lamps, photographic flood lamps, laser and the like.

When actinic radiation is used for curing, a photoinitiator is normally added to the composition to increase the reaction rate. Initiators or catalysts which are operative in the present invention are those which are capable of initiating photopolymerization under the influence of actinic light. The preferred catalyst or initiators are substantially soluble in the photopolymerizable composition, and are effective in promoting rapid polymerization, by which the composition is cured. Many suitable photopolymerization initiators or catalysts are listed in U.S. Pat. No. 4,008,341 the contents of which are incorporated herein by reference. The preferred photoinitiators are the aldehyde and ketone carbonyl compounds having at least one aromatic nucleus attached directly to the

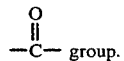
group.

The more preferred photoinitiators are benzophenone and 2,2 dimethoxy 2-phenyl actophenone.

The composition of the instant invention can also be cured by high energy ionizing irradiation or bombardment such as is described in the aforesaid U.S. Pat. No. 4,008,341.

In an alternate preferred form of the present invention a low molecular weight liquid rubber polymer may be incorporated in the previously described compositions in order, for example, to increase the softness of relief plates made therefrom. Suitable liquid rubber polymers have molecular weights of 750 to 3000 and comprise butadiene homopolymers and copolymers containing at least 30% by copolymer weight, more preferably at least 60% by copolymer weight butadiene with the remainder being either styrene or acrylonitrile. The addition of such liquid rubber polymers should not constitute greater than 50% by weight of the total composition and preferably should constitute from 0.1–50%, more preferably 5–30% by weight of the total composition. By liquid rubber polymer it is meant one that is liquid below 23° C.

The composition of the present invention may in proper instances include such additives as antioxidants, inhibitors, activators, fillers, pigments, dyes, antistatic agents, viscosity modifiers, plasticizers and the like. The aforesaid additives may be present in quantities up to 500 parts or more per 100 parts of radiation curable composition by weight and preferably 0.0005 to 300 parts on the same basis. The type of concentration of the additives must be selected with care so that the final composition remains suitable for its use in preferred embodiments radiation curable under conditions of exposure.

The curing period may be retarded or accelerated from less than 1 minute to 30 days or more. Conventional curing inhibitors or retarders which may be used in order to stabilize the components or curable compositions so as to prevent premature onset of curing may include hydroquinone; p-tertbutyl catechol; 2,6-di-tert-butyl-p-methylphenol; penothiazine; N-phenyl-2-naphthylamine; phosphorus acid; pyrogallol and the like. Conventional reaction promoters which give faster curing reaction rates and broaden the range of utilizable light wavelengths include trimethylphosphite, triethylphosphite, triphenylphosphite, rose bengal and acetone.

The method of mixing the components of the photosensitive compositions of the present invention is not critical, and does not constitute part of the invention. Solutions and dispersions of the photopolymerizable compositions can be made with such solvents as aromatic hydrocarbons, e.g. benzene, toluene and xylene; chlorinated hydrocarbons, e.g. chloroform, carbon tetrachloride, trichloroethylene and chlorotoluene; ketones, e.g. methyl ethyl ketone, diethyl ketone and methyl isobutyl ketone and blends of such solvents. On the other hand, solid mixes may be prepared by mixing the components on a mill or in an internal mixer such as a Banbury. The resultant polymerizable compositions may be in the form of a liquid solution, liquid dispersion, or as a solid mix. The liquid solution or liquid dispersion may be cast directly upon a substrate, or first cast upon a suitable wheel or belt, stripped, and then affixed to a substrate surface. The solid mix may be extruded or calendered directly upon the substrate or as a self-supporting sheet and then affixed to the surface of the substrate.

A convenient method of forming a printing plate, which is the preferred form of the invention, is to place an image-bearing, line or halftone, stencil or positive or negative transparency parallel to the surface of the photocurable composition which is secured to a support or to a light-absorptive layer on the support. The image-bearing transparency and the surface of the photocurable composition should preferably be in contact. To make possible easy removal of the image-bearing transparency from the printing plate after photopolymerization, it is desirable to coat the printing plate with a "parting" layer or slip coat. Suitable coatings include the conventional acrylic latex slip coats, silicon greases etc. The photocurable layer is exposed through the transparency to a source of actinic light until the photocurable layer is cured to an insoluble stage in the exposed areas. The thickness of the ultimate relief in such a process may be controlled by varying the thickness of the layer of the photocurable composition, and/or the exposure time.

Development can be carried out by conventional means. In general after exposure of the plates, the unexposed areas are removed by suitable means such as a suitable solvent liquid which has good solvent action on the unexposed radiation curable composition and relatively little action on the cured, photopolymerized image or upon the substrate, antihalation coating, or any anchor layer, in the period required to remove the non-polymerized portions. Suitable organic solvents for most of the unexposed radiation curable compositions include aliphatic hydrocarbons such as hexane, octane, mineral oil, naphthas, etc. aromatic solvents such as toluene, xylene, etc., halogenated organic solvents such as methylene chloride, trichloroethane, Freon$^D$, etc., and blends of such solvents. The best solvent to use depends on the exact composition of the radiation curable composition. In the development step where the relief is formed the solvent may be applied in any convenient manner, as by pouring, immersion, or spray. Brushing or agitation aid in the removal of the non-polymerized portion of the composition. The use of ultrasonic washing techniques is a convenient means of removing the non-polymerized areas of the relief printing plate. In the case of liquid systems an air knife stripping can be employed to remove the unexposed areas.

The preferred relief plate of the present invention is preferably formed in a layer of the photopolymerizable composition, typically 2 to 200 mils in thickness, adhered to a flexible backing. Layers ranging from 3 to 60 mils thickness will be used for the majority of the letterpress printing plates. Layers thicker than 50 to 60 mils can be used for the printing of designs and relatively large areas in letterpress printing plates. In general, the relief height-forming stratum of the photopolymerizable layer should be essentially non-light scattering. It is important that the final photosensitive composition possess sufficient clarity so as to permit the passage of light in sufficient quantity to effect the addition-photopolymerization.

In making printing plates it is important that the exposure be sufficient to harden the photocurable composition in the exposed image areas without causing significant curing in the non-image areas. Aside from exposure time and light intensity, the extent of the exposure is dependent on the thickness of the photocurable layer, the curing temperature, the polymer used, the monomer used, the thiol employed, the photoinitiator, diluent, the presence of light absorbing pigments or dyes in the photocurable composition and the character of the image to be reproduced. In general, the thicker the layer to be cured, the longer the exposure time. Curing generally starts at the surface of the photocurable layer closest to the light source and proceeds downward to the support. With insufficient exposure, the layer may have a hard cure at the surface but, through lack of a clearthrough cure, the relief will be removed when the unexposed area is removed. Inasmuch as the curing rate usually increases at higher temperature, less exposure is required there than at room temperature. Thus, ultraviolet light sources that emit heat are more efficient than cold ultraviolet light sources. However, care must be exercised that too high a temperature is not attained during the photocure, as this leads, in some cases, to thermal expansion of the photocurable composition which results in image distortion. Hence, it is preferred that the photocuring be carried out at a temperature in the range about 20° to about 70° C. Due to the number of variables which affect exposure time, optimum results are best determined emperically e.g. stepped exposures with characterization after each exposure.

A supporting base material, i.e. the substrate, which acts as a support for the photosensitive composition in the preferred printing plate products may be practically any natural or synthetic product capable of existing in film or sheet form, which is generally dimensionally stable and flexible. It is a common practice, known to those skilled in the art, to use sheet metals such as aluminum or steel, or plastics such as polyester of polyamide film, as substrates. The preferred substrate supporting base material is a polyester film. Such materials are rendered non-reflective, where necessary, by coating with an antihalation layer. Suitable antihalation coatings can be made by dispersing in a solution or aqueous dispersion of a resin or polymer a finely divided dye or pigment which substantially absorbs actinic light. The antihalation layer may also be formulated such that it acts as a binder or adhesive layer between the substrate and photosensitive composition. Antihalation pigments include carbon black, manganese dioxide and dyes, e.g. Acid Blue Black (CI20470) and Acid Magenta O (CI 42685). A dyed metal plate is also useful.

In those instances where rotary press plates are desired, the support material may be used to form flat relief plates which are then formed to the desired shape. Such rotary press plates may also be prepared by using cylindrically shaped support plates of the various types carrying the curable composition and exposing them directly to actinic light through a concentrically disposed image-bearing transparency.

It is believed that the following explanation accounts for much of the viability of the present invention. In curing the composition of this invention the terminal vinyl groups, be they in the unsaturated polymer or in the reactive monomer, undergo addition polymerization. At the same time, the thiol group competes with molecular oxygen for free radicals, the thiol group forming radicals faster (less activation energy) thus minimizing the formation of hydroperoxide radicals the tack causing moiety.

The following schematic utilizing a benzoin ether initiator is used to hypothesize how the use of the polythiol minimizes tack.

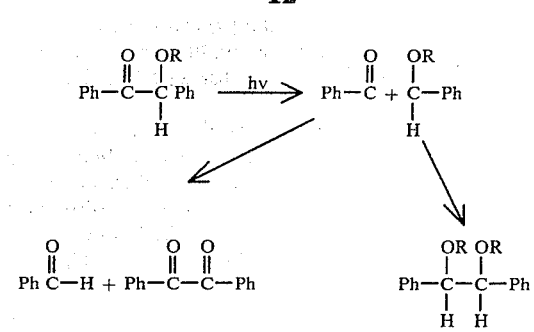

Benzoin and benzoin ethers fragment into a radical pair, a benzoyl and a benzyl radical. The benzoyl radical

is very reactive, reacting primarily by hydrogen abstraction, which makes it a very efficient initiator, e.g.

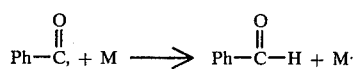

The newly formed radical M starts the polymerization by reacting with an acrylic or vinylic double bond:

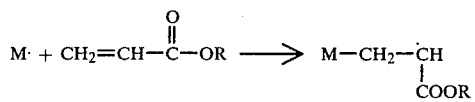

Polymerization proceeds stepwise by adding more and more monomer to the growing chain.

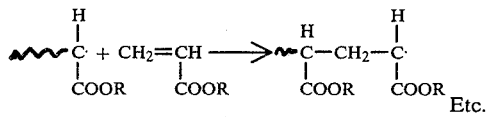

A number of things can happen to a growing chain:
a. it can abstract a hydrogen from another molecule. e.g.

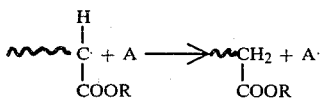

This terminates the chain. The new radical A· may or may not start a new chain.

b. The growing chain encounters another radical and reacts with it under formation of a covalent bond.

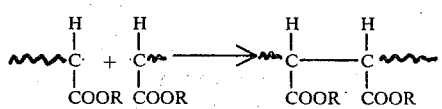

c. The most serious problem: The growing chain is intercepted by an oxygen molecule which results in the formation of a peroxy radical, that then can decompose without starting a new chain or continuing the original chain.

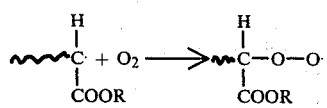

will not initiate any further polymerization.

Obviously oxygen interferes with the polymerization and must be kept away, otherwise the surface where most of the oxygen can be found consists of a layer of low molecular material characterized by a tacky state.

If in the above schematic we now place a thiol compound the following can happen:

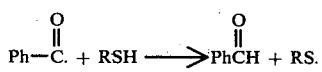

The benzoyl radical abstracts a hydrogen from the thiol compound (activation energy consideration) to form the thiyl radical.

The thiyl radical can then start chain growth

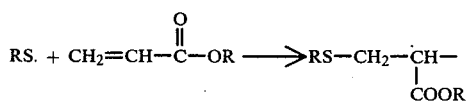

The growing chain can now enter into the following reactions:

(a) hydrogen abstraction from another polymer molecule

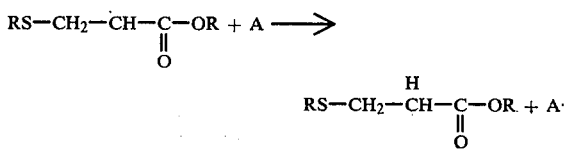

(b) coupling

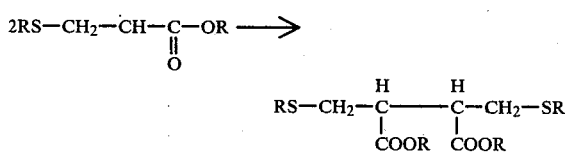

(c) competition with RSH and oxygen.

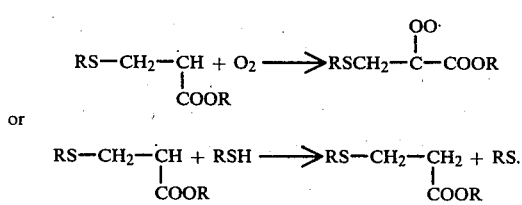

The reaction kinetics favor the thiyl radical formation rather than peroxide formation. Thus you get a growth step rather than a termination reaction. The growth step via the thiyl radical prevents oxygen from entering into the polymerization thus minimizing surface tack.

The compositions of the invention and the process of the invention may be used for the manufacture of relief plates for letterpress printing as well as flexographic printing (solid plates). They have the advantage over other addition polymerizable systems for the manufacture of printing plates, that plates with relief images of great sharpness may be produced with short exposure times. Even in the presence of air, printing plates with tack-free surfaces can be produced rapidly. Furthermore such plates exhibit good ink transfer properties and are, in general, swollen only slightly by printing inks. These properties are, of course, influenced by the basic nature of the resin or binder system used.

As used herein the term "cure" means the relative curing of the radiation curable composition. This is compared with the description "removing the unexposed radiation curable composition" which means removing the material that is relatively uncured. In context it is believed this is clear and that it will be understood that the term "cure" or "cured" does not mean that no further curing could take place and that the term unexposed does not mean that no radiation reached that portion of the composition. Primarily the terms refer to the state enabling the separation of the "cured" from the unexposed and thus uncured. The term "tack-free" means tack-free to touch with the human hand and therefore freedom from being sticky in general. The term "tacky" means tacky to touch with the human hand and therefore in general sticky and tending to have materials that contact such a surface adhere to the surface.

By limiting the thiol to an amount that will not basically change the curing properties it is meant, basic properties like stiffness, firmness, resiliency and brittleness are not grossly changed. Obviously surface tack is eliminated in the case of the preferred polythiols and substantially reduced in the case of other thiols such as the monothiols. In addition a slight photopolymerization rate increase occurs as do some other slight changes in other properties.

This invention is further illustrated by the Examples. Where not otherwise indicated, formulations given in parts are to be understood to be parts by weight.

EXAMPLE I

A photosensitive composition consisting of the following mixture was prepared:
 (a) 100 parts of styrene-isoprene-styrene (SIS) block copolymer.
 (b) 15 parts of trimethylolpropane trimethacrylate.
 (c) 2 parts pentaerylthritol tetrakis ($\beta$-mercaptopropionate).
 (d) 2 parts 2,2 dimethoxy 2-phenyl acetophenone.
 (e) 2 parts hindered phenol (Ionol ®)(a curing inhibitor).

The particular SIS copolymer was Kraton ® 1107, manufactured by the Shell Chemical Company, and was composed of approximately 14% by weight polystyrene equally distributed between the two end blocks, the remainder being polyisoprene. The relief plate was prepared by dissolving the composition in toluene in a stirred resin kettle. Ingredient (a) was charged in first and dissolved followed by (b), (d) and (e) in rapid succession and then (c) after the others had dissolved. The solution was then cast to a thickness of approximately 80 mils on a polyester backing sheet.

The dried photosensitive layer was then coated with a standard commercial amide based slip coat to less than ¼ mil. A 10-inch by 12-inch piece of the resultant plate was placed in a vacuum frame, and the coated photopolymer surface was brought into contact with a line process negative. The element was then exposed to actinic radiation (5000 μW/cm²) for 1.00 min. After exposure, the negative was stripped from the element, and the element was subjected to an etch bath containing trichloroethane to remove the unexposed polymer. A relief image corresponding to the clear areas of the negative was obtained. The photopolymerized relief plate was characterized by excellent softness, resilience, sharpness of image and essentially a tack free surface. The plate was placed on a printing cylinder, on a flexo press and excellent prints of the original image were obtained on polyester film. The relief plate also had excellent abrasion resistance, durability, and resistance to printing ink solvents as determined by visual observation.

The composition of Example I had the following properties $$\frac{100 \text{ parts } (SIS)}{121 \text{ parts } - \text{ total all ingredients}} \times 100 = 82\% \text{ by weight of the composition is mono-alkenyl aromatic-diene copolymer resin or material (1).}$$

$$\frac{15 \text{ parts trimethylolpropane trimethacrylate}}{100 \text{ parts } (SIS)} \times 100 = 15\% \text{ by weight of material (1) of monomer substantially compatible with material (1) and having at least one photo-cross linkable C—C double unsaturated bond.}$$

$$\frac{2 \text{ parts pentaerythritol tetrakis } (\beta\text{-mercaptopropionate})}{100 \text{ parts } (SIS)} \times 100 = 2\% \text{ by weight of material (1) of polythiol.}$$

$$\frac{2 \text{ parts 2,2 dimethoxy 2-phenyl acetophenone}}{100 \text{ Parts } (SIS)} \times 100 = 2\% \text{ by weight of material (1) of photoinitiator.}$$

EXAMPLE II

A printing plate was prepared essentially as in Example I except the composition consisted of the following mixture:
(a) 100 parts of the same SIS copolymer.
(b) 20 parts trimethylolpropane trimethacrylate.
(c) 2 parts pentaerythritol tetrakis (β-mercaptopropionate)
(d) 2 parts 2,2 dimethoxy 2-phenyl acetophenone.
(e) 2 parts hindered phenol.

The results were essentially the same as those described in Example I including the printing test results.

EXAMPLE III

A printing plate was prepared essentially as in Example I except the composition consisted of the following mixtures:
(a) 100 parts of the same SIS copolymer
(b) 15 parts trimethylolpropane trimethacrylate
(c) 2 parts pentaerythritol tetrakis (β-mercaptopropionate)
(d) 4 parts benzophenone
(e) 2 parts hindered phenol.

The results were essentially the same as those described in Example I, including the printing test results.

EXAMPLE IV

A printing plate was prepared essentially as in Example I, except the composition consisted of the following mixture:
(a) 100 parts of the same SIS copolymer
(b) 15 parts trimethylolpropane triacrylate.
(c) 2 parts pentaerythritol tetrakis (β-mercaptopropionate)
(d) 2 parts 2,2 dimethoxy 2-phenyl acetophenone
(e) 2 parts hindered phenol.

The results were essentially the same as those described in Example I, including the printing test results.

EXAMPLE V

A printing plate was prepared essentially as in Example I except the composition consisted of the following mixture:
(a) 100 parts of styrene-butadiene-styrene (SBS) block copolymer (Kraton ® 1102, Shell Chemical Company).
(b) 15 parts trimethylolpropane trimethacrylate
(c) 2 parts pentaerythritol tetrakis (β-mercaptopropionate)
(d) 2 parts 2,2 dimethoxy 2-phenyl acetophenone
(e) 2 parts hindered phenol.

The ingredients were not dissolved in toluene but where instead blended in an internal shear mixer and subsequently calendered onto a polyester backing.

The results were essentially the same as those described in Example I, including the printing test results.

EXAMPLE VI

A printing plate was prepared essentially as in Example I except the composition consisted of the following mixture:
(a) 100 parts of the same SIS copolymer
(b) 15 parts trimethylolpropane trimethacrylate
(c) 2 parts pentaerythritol tetrakis (β-mercaptopropionate)
(d) 2 parts 2,2 dimethoxy 2-phenyl acetophenone
(e) 2 parts hindered phenol.
(f) 15 parts liquid butadiene rubber (Arco's Poly bd CS-15)

The results were essentially the same as those described in Example I, including the printing test results.

EXAMPLES VII—XII

Controls

The procedures of Example I-V were repeated respectively except ingredient (c), the pentaerythritol tetrakis (β-mercaptopropionate), was omitted in each Example.

The plates possessed similar properties except they had tacky surfaces to touch as tested by touching the surface with the hand. In addition the plates exhibited slower activation as is illustrated quantitatively in Table 1 which follows Example XIV.

EXAMPLE XIII

Control

A printing plate was prepared essentially as in Example I except the composition consisted of the following mixture:
(a) 100 parts of the same SIS copolymer.
(b) 10 parts trimethylolpropane trimethacrylate.
(c) None
(d) 1 part 2,2 dimethoxy 2-phenyl acetophenone.
(e) 2 parts hindered phenol.

These results were essentially the same as those of the other controls described in Examples VII–XII.

EXAMPLE XIV

A printing plate was prepared essentially as in Example I except the composition consisted of the following mixture:
(a) 100 parts of the same SIS copolymer.
(b) 10 parts trimethylolpropane trimethacrylate.
(c) 2 parts pentaerythritol tetrakis (β-mercaptopropionate)
(d) 1 part 2,2 dimethoxy 2-phenol acetophenone.
(e) 2 parts hindered phenol.

The results were essentially the same as those described in Example I including the printing test results.

TABLE 1

| EX. | ELONGA-TION | TEN-SILE | RESIL-IENCE | SHORE A | ACTIVITY |
|---|---|---|---|---|---|
| XIII | 414 | 952 | 54 | 62 | 1100 |
| XIV | 500 | 728 | 59 | 60 | 800 |
| IV | 455 | 892 | 52 | 63 | 725 |

The higher the activity number the longer is the period required for adequate cure. Thus, as a general proposition, the lower the "activity" number the better the printing plate formation performance of the composition. The activity number is the minimum number of light units required to stabilize a 5%–150 line halftone dot in a photosensitive layer to form a printing plate. The photosensitive layer is exposed through a test negative containing the indicated data and then the photosensitive layer is etched as described in the Examples except with varient light units. The units recorded are read from a light integrator which controls the number of light units used. Elongation and Tensile were determined by ASTM method D2707-72. Resilience was determined by ASTM method D2632-74 and Shore A was determined by ASTM method D2240-75.

EXAMPLE XV

To a resin kettle there was charged 362 grams of toluene and one hundred sixty-three (163) grams of a plastic polychloroprene (155 g WRT+40 g of AD-40). Then there was added 15.1 grams of trimethylolpropane trimethacrylate, 0.8 grams of 2,6 di-t-butyl cresol, 1.6 grams of 2,2 dimethoxy 2-phenyl acetophenone and 3.3 grams of pentaerythritol tetrakis (B-mercaptopropionate). After thorough mixing the solution was cast by pouring into a mold (8"×10"×0.1"). The dried thickness was 100 mils. The polymerizable layer was adhered to a polyester substrate and the resulting plate was placed in a vacuum frame, and the polymer surface brought into contact with a line negative and exposed as in Example I except the exposure duration was several minutes. After exposure, the negative was stripped from the plate and the unexposed polymer was removed as in Example I.

A relief image of at least 30 mils corresponding to the clear areas of the negative was obtained. The photopolymer was extremely resilient, free from brittleness and tack and bendable such that no adverse effect was observed when bending through 180°. The plate was placed on a printing cylinder as in Example I and satisfactory prints of the original image were obtained. The plate was free of tack to hand touch.

EXAMPLE XVI

The procedure of Example XV was repeated except 13.0 grams of trimethylolpropane triacrylate was substituted for the 15.1 grams of trimethylolpropane trimethacrylate and the solution was cast directly onto an aluminum substrate. The printing results were the same as in Example XV and the plate was free of tack to hand touch.

EXAMPLE XVII

To a resin kettle equipped with a thermometer there was charged 130 grams of Multrathene F-196 (isocyanate terminated polyether from Mobay) and 32 grams (an excess) of propylene glycol monoacrylate along with 3 drops of stanneous octoate as a catalyst. The reaction was run at 70° C. for 2 hours at which time the NCO value was zero (IR determination). Then 20 grams of acetophenone (curing agent) and 0.7 grams of Ionol (antioxidant) were added to the reaction mixture. This mixture was stirred for ½ hour at 60° C. and then divided into 2 parts. To Part 1 there was added 8.0 grams of polythiol, pentaerythritol tetrakis (B-mercaptopropionate) with stirring. Nothing was added to part 2.

Part 1 solution and part 2 solution were each independently coated on an aluminum substrate to a thickness of approximately 20 mils and exposed to UV radiation (mercury lamp) for 40 seconds. On examination the part 1 coating and the part 2 coating appeared to be through (throughout its thickness) cured but the part 2, non-thiol containing coating, was tacky on the surface while the part 1 thiol containing coating was not. The curing was determined by visual observation and the tackiness by hand touch.

EXAMPLE XVIII

To a resin kettle there was charged 163 grams of isophorone diisocyanate with 5 drops of stanneous octoate. To this mixture there was added 103 grams of hydroxypropyl methacrylate keeping the reaction temperature below 50° C. by cooling water. After exotherm had subsided the mixture was heated to 60° C. for 3 hours at which time the NCO value was 2.6 meg/gram. At this time 400 grams of polypropylene glycol (M.W. 1025) was added and resulting mixture heated at 60° C. for 8 hours. Analysis for free NCO after 8 hours was zero. Then 220 grams of diethyleneglycol dimethacrylate was added to the mixture with stirring followed by 8 grams of 2,2dimethoxy 2 phenol acetophenone 1.0 gram Ionol and 6.5 grams triphenylphosphite. The resulting mixture was heated for 2 hours at 60° C. The mixture was then divided into 2 parts. To part 1 there was added 30 grams of a polythiol trimethylolpropane trimercaptopropionate. Nothing was added to part 2.

Part 1 solution and part 2 solution were each independently coated on a polyester substrate to a thickness of approximately 20 mils and exposed to actinic light as in Example XVII but for 45 seconds.

Examination of both films in the manner of Example XVII revealed that both the part 1 and the part 2 coatings appeared to be through cured but the non-thiol containing coating was tacky on the surface while the part 1 coating was not.

EXAMPLE XIX

The procedure of Example XVIII was repeated except trimethylolpropane triacrylate was substituted for the diethyleneglycol dimethacrylate.

Examination of both films in the manner of Example XVII revealed that both the part 1 and the part 2 coatings appears to be through cured but the non-thiol containing coating was tacky on the surface while the part 1 coating was not.

EXAMPLE XX

The procedure of Example XVIII was repeated except pentaerythritol tetrakis (B-mercaptopropionate) was substituted for the trimethylolpropane trimercaptopropionate.

Examination of both films in the manner of Example XVII revealed that both the part 1 and the part 2 coatings appeared to be through cured but the non-thiol containing coating was tacky on the surface while the part 1 coating was not.

EXAMPLE XXI 375 grams of toluene diisocyanate was added to a 3 liter glass resin kettle together with 0.295 grams stannous octoate catalyst. Then 308.8 grams of hydroxypropyl methacrylate was added at such a rate that the temperature did not exceed 60° C. After addition was complete, the reaction mixture was heated for 1 hour at 60° C. and then a further 0.31 grams of stannous octoate was added. Then 12888.2 grams of polypropylene glycol having a molecular weight of about 1000 (available from Union Carbide under the tradename "PPG 1025") was added and heating at 60° C. was continued for 3 hours until the NCO dropped to zero. Then 1.97 grams of 2,6-di-tert butyl phenol stabilizer was then added. The thus formed methacrylate terminated polyene will hereinafter be referred to as Prepolymer A.

EXAMPLE XXII 42 lbs. of commercially available toluene diisocyanate was charged to a 30 gallon glass reactor together with 15.0 grams of stannous octoate. 163 grams of triphenyl phosphite was then added followed by 31.4 lbs. of hydroxypropyl acrylate at such a rate that the temperature did not exceed 60° C. Then 17.0 grams of additional stannous octoate was added followed by 133 lbs. of polypropylene glycol having a molecular weight of about 1000 (available from Union Carbide under the tradename "PPG 1025").

The reaction mixture was heated at 60° C. until no unreacted isocyanate could be detected. The thus formed acrylate-terminated polyene will hereafter be referred to as Prepolymer B.

EXAMPLE XXIII 803 parts of Prepolymer A from Example XXI was compounded with 281 parts of diethylene glycol dimethacrylate, 8.7 parts of triphenylphospite, 10.9 parts of 2,2-dimethoxy-2-phenylacetophenone, 2.2 parts 2,6-di-tert butyl phenol and 54 parts of trimethylolpropane tris (β-mercaptopropionate). The mixture was then heated 1 hour at 60° C.

A 20 mil thick layer of this formulation was then doctored on to a 10 mil aluminum sheet coated with an adhesion promoting layer. The polymer was briefly exposed (5.88 sec.) to a UV source. A negative of a newspaper page was then held accurately above the photopolymer layer with a 15 mil air gap between the two. A second exposure (45 sec.) was then carried out through the negative using the same UV source. The imaged plate was then etched using a blast of compressed air which left a relief image of excellent fidelity suitable for printing. The plate was free of tack to hand touch.

EXAMPLE XXIV

The procedure of Example XXIII was repeated except a monothiol, β mercaptopropionate acid, was substituted for the polythiol.

The resulting plate had substantially the same quality as the plate of Example XXIII except the surface was somewhat tacky, unlike the plate of Example XXIII. The tackiness was, however, much less than with such a formulation with no thiol included.

EXAMPLE XXV 307 lbs. of Prepolymer B from Example XXII was compounded with 69 lbs. of diethylene glycol dimethacrylate, 5.5 lbs of benzoin isobutyl ether and 627.5 grams of triphenylphosphite. The mixture was heated for 1 hour at 60° C. and then 7.2% based on the total weight in the reactor of the tetramercaptopropionate ester of pentaerythritol was added, followed by 0.2% by weight of octadecyl-B-(4-hydroxy-3,5-di-t-butyl phenyl) propionate and 0.1% by weight of 2,6-di-tert butyl-4-methyl phenol.

This material was used to prepare a printing plate as described in Example XXIII. A sharp relief image of excellent fidelity was obtained. The plate was free of tack to hand touch.

EXAMPLE XXVI 100 grams of Prepolymer B from Example XXII was diluted with 80 grams of diethylene glycol diacrylate. 0.48 grams of triphenylphospite, 0.20 grams di-tert butyl phenol, 5.0 grams of benzophenone, 1.0 grams of methyldiethanolamine were then added and the mixture heated for 30 minutes at 60° C. 10 grams of the trimercaptopropionate ester of trimethylolpropane was then added together with 10 grams of N-vinyl-2-pyrrolidone.

This material was then coated as a thin film over a conventional white base coat on steel can stock. The coating was cured at 150 ft./min in a Radiant Products UV oven using three 200 watts/in. mercury lamps. The cured coating had excellent gloss, abrasion resistance and adhesion and did not crack when the metal was stamped and formed.

This invention provides a simple, effective relief printing plate utilizing inexpensive materials and minimal labor requirements. The images obtained are sharp and show fidelity to the original transparency both in small details and overall dimensions. A significant advantage arises from the fact that the softness and flexibility of the photopolymerized printing plates makes possible the use of "kiss impression" printing techniques. This printing technique is preferred especially by the book publishing industry as it allows use of coarse "antique" papers, as well as higher press speeds.

The abrasion resistance of the photopolymerized printing plates make the plate more durable than those presently available. An important commercial advantage is their lightness in weight. Of primary importance, the present invention provides a composition that eliminates the need for de-tackifying treatments in the plate making process while retaining all of the advantages.

While in accordance with the patent statutes, we have described what at present is considered to be the preferred embodiment of our invention, it will be obvious to those skilled in the art that numerous changes and modifications may be made therein without departing from the invention and it is therefore aimed in the appended claims to cover all such equivalent variations as fall within the true spirit and scope of the invention.

What we claim is:

1. The method of forming a printing plate which comprises
   (A) Applying to a polyester film substrate in a coating thickness of about 2 to about 200 mils, a radiation curable composition comprising
      (1) about 60 to about 95% by weight of said composition of C-C unsaturated acrylonitrile resin having a macromolecular structure and being a polyene having a weight average molecular weight of at least about 5,000;
      (2) about 5 to about 30% by weight of said acrylonitrile resin of at least one monomer of an addition photopolymerizable polyethylenically unsaturated acrylic or methacrylic acid ester containing one or more acrylate or methacrylate groups per molecule or mixtures thereof having at least one photocrosslinkable C—C unsaturated bond;
      (3) about 0.01 to about 10% by weight of said acrylonitrile resin of photoinitiator; and
      (4) about 0.5 to about 10% by weight of said acrylonitrile resin of polythiol having the general formula $R_8$—$(-SH)_n$ where n is at least 2 and $R_8$ is a polyvalent organic moiety free from reactive carbon to carbon unsaturation, said polythiol being limited to an amount that will not basically change the curing properties of the combination of components (1), (2) and (3) of said radiation curable composition,
   (B) Exposing to actinic radiation projected through an image-bearing transparency selected portion of said radiation curable composition for a time sufficient to cure said radiation curable composition in the exposed portions, and
   (C) Thereafter removing the unexposed radiation curable composition, forming a resilient printing plate that has a surface having a substantially reduced tack compared to a printing plate formed from the same composition except the polythiol.

2. A composition comprising
   (1) about 60 to about 95% by weight of said composition of a C—C unsaturated polymeric acrylonirile resin having a macromolecular structure and being a polyene having a weight average molecular weight of at least about 5,000;
   (2) about 5 to about 30% by weight of material (1) of at least one monomer that is an addition polymerizable polyethylenically unsaturated acrylic or methacrylic acid ester containing two or more acrylate or methacrylate groups per molecule or mixtures thereof having at least one crosslinkable C—C unsaturated bond;
   (3) about 0.01 to about 10% by weight of said acrylonitrile resin of photoinitiator; and
   (4) about 0.5 to about 10% by weight of said acrylonitrile resin of polythiol having the general formula $R_8$—$(-SH)_n$ where n is at least 2 and $R_8$ is a polyvalent organic moiety free from reactive carbon to carbon unsaturation, said composition curing with a surface of at least a substantially reduced tack compared to the same composition except the polythiol and forming a resilient cured member.

3. The method of forming a coating on a substrate which comprises applying to the surface of a substrate a layer of a composition comprising
   (1) about 60 to about 95% by weight of said composition of a C—C unsaturated acrylonitrile resin having a macromolecular structure and being a polyene having a weight average molecular weight of at least about 5,000;
   (2) about 5 to about 30% by weight of material (1) of at least one monomer that is an addition photopolymerizable polyethylenically unsaturated acrylic or methacrylic acid ester containing two ore more acrylate or methacrylate groups per molecule or mixtures thereof having at least one radiation crosslinkable C—C unsaturated bond;
   (3) about 0.01 to about 10% by weight of material (1) of photoinitiator; and
   (4) about 0.5 to about 10% by weight of material (1) of polythiol having the general formula $R_8$—$(-SH)_n$ where n is at least 2 and $R_8$ is a polyvalent organic moiety free from reactive carbon to carbon unsaturation and thereafter exposing the layer to radiation, forming a resilient coating that has a surface having a substnatially reduced tack compared to a printing plate formed from the same composition except the polythiol.

4. The method of forming a printing plate which comprises
   (A) applying to a polyester film substrate in a coating thickness of about 2 to about 200 mils a radiation curable composition comprising
      (1) about 60 to about 95% by weight of said composition of a C—C saturated polymeric binder having a macromolecular structure and a weight average molecular weight of at least about 5,000;
      (2) about 5 to about 30% by weight of said C—C saturated binder of at least one monomer that is an addition photopolymerizable polyethylenically unsaturated acrylic or methacrylic acid ester containing two or more acrylate or methacrylate groups per molecule or mixtures thereof and having at least one photocrosslinkable C—C unsaturated bond;
      (3) about 0.01 to about 10% by weight of said C—C saturated binder of photoinitiator; and
      (4) about 0.5 to about 10% by weight of said C—C saturated binder of polythiol having a general formula $R_8$—$(-SH)_n$ where n is at least 2 and $R_8$ is a polyvalent organic moiety free from reactive carbon to carbon unsaturation, said polythiol being limited to an amount that will not basically change the curing properties of the combination of components (1), (2) and (3) of said radiation curable composition;
   (B) Exposing to actinic radiation projected through an image-bearing transparency selected portions of said radiation curable composition for a time sufficient to cure the radiation curable composition in the exposed portions; and (C) thereafter removing the unexposed radiation curable composition, forming a resilient printing plate that has a surface having a substantially reduced tack compared to a printing plate formed from the same composition except the polythiol.

5. A composition comprising (1) about 60 to about 95% by weight of said composition of a C—C saturated polymeric binder having a macromolecular structure and a weight average molecular weight of at least about 5,000;

(2) about 5 to about 30% by weight of material (1) of at least one monomer having at least one crosslinkable C—C unsaturated bond;

(3) about 0.01 to about 10% by weight of said C—C saturated polymeric binder of photoinitiator; and (4) about 0.5 to about 10% by weight of said C—C saturated binder of polythiol having the general formula $R_8$—$(-SH)_n$ where n is at least 2 and $R_8$ is a polyvalent organic moiety free from reactive carbon to carbon unsaturation, said composition curing with a surface of at least a substantially reduced tack compared to the same composition except the polythiol and forming a resilient cured member.

6. The method of forming a coating on a substrate which comprises applying to the surface of a substrate a layer of a composition comprising (1) about 60 to about 95% by weight of said composition of a C—C saturated polymeric binder having a macromolecular structure and a weight average molecular weight of at least about 5,000;

(2) about 5 to about 30% by weight of said C—C saturated binder of at least one monomer that is an addition photopolymerizable polyethylenically unsaturated acrylic or methacrylic acid ester containing two or more acrylate or methacrylate groups per molecule or mixture thereof having at least one radiation crosslinkable C—C unsaturated bond;

(3) about 0.01 to about 10% by weight of said C—C saturated polymeric binder of photoinitiator; and (4) about 0.5 to about 10% by weight of said C—C saturated binder of polythiol having the general formula $R_8$—$(-SH)_n$ where n is at least 2 and $R_8$ is a polyvalent organic moiety free from reactive carbon to carbon unsaturation and thereafter exposing the layer to radiation, forming a resilient coating that has a surface having a substantially reduced tack compared to a printing plate formed from the same composition except the polythiol.

* * * * *